(12) United States Patent
Kakishima et al.

(10) Patent No.: US 12,477,711 B2
(45) Date of Patent: Nov. 18, 2025

(54) TRAY HANDLING DEVICE AND TRAY HANDLING METHOD

(71) Applicant: PANASONIC INTELLECTUAL PROPERTY MANAGEMENT CO., LTD., Osaka (JP)

(72) Inventors: Nobuyuki Kakishima, Yamanashi (JP); Yasuyuki Ishitani, Yamanashi (JP); Hirofumi Obara, Yamanashi (JP); Kazuo Ohuchi, Ehime (JP); Jun Kamiyamaguchi, Yamanashi (JP); Takanori Yoshitake, Yamanashi (JP); Ryota Inoue, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 415 days.

(21) Appl. No.: 17/904,522

(22) PCT Filed: Nov. 4, 2020

(86) PCT No.: PCT/JP2020/041252
§ 371 (c)(1),
(2) Date: Aug. 18, 2022

(87) PCT Pub. No.: WO2021/166334
PCT Pub. Date: Aug. 26, 2021

(65) Prior Publication Data
US 2023/0077814 A1 Mar. 16, 2023

(30) Foreign Application Priority Data
Feb. 21, 2020 (JP) .................. 2020-028729

(51) Int. Cl.
*H01F 7/06* (2006.01)
*H05K 13/02* (2006.01)
*H05K 13/04* (2006.01)

(52) U.S. Cl.
CPC ....... *H05K 13/021* (2013.01); *H05K 13/0434* (2013.01)

(58) Field of Classification Search
CPC ................... H05K 13/021; H05K 13/0434
See application file for complete search history.

(56) References Cited

U.S. PATENT DOCUMENTS

| 4,932,828 A | 6/1990 | Katae et al. |
| 6,524,052 B1 * | 2/2003 | Yamauchi ............ H05K 13/021 414/811 |

(Continued)

FOREIGN PATENT DOCUMENTS

| CN | 106797713 A | 5/2017 |
| CN | 107640357 A | 1/2018 |

(Continued)

OTHER PUBLICATIONS

International Search Report dated Jan. 12, 2021 issued in Patent Application No. PCT/JP2020/041252.

(Continued)

*Primary Examiner* — Paul D Kim
(74) *Attorney, Agent, or Firm* — MCDONALD HOPKINS LLC

(57) ABSTRACT

A tray is automatically mounted on a pallet. A tray handling device, which handles a tray collected from a component mounting device configured to mount a component held in a tray on a substrate, includes: a pallet collecting unit configured to take out a pallet on which the tray is mounted from a magazine collected from the component mounting (Continued)

device; and a tray unloading unit configured to unload the tray from the collected pallet.

19 Claims, 16 Drawing Sheets

(56) References Cited

U.S. PATENT DOCUMENTS

| | | | | |
|---|---|---|---|---|
| 9,999,170 | B2* | 6/2018 | Iwata | H05K 13/0434 |
| 10,986,760 | B2* | 4/2021 | Hando | B65G 47/90 |
| 2009/0129898 | A1* | 5/2009 | Ruden | B23P 19/001 |
| | | | | 414/800 |
| 2010/0256801 | A1 | 10/2010 | Ohno | |
| 2013/0045066 | A1* | 2/2013 | Song | H05K 13/0434 |
| | | | | 414/808 |
| 2017/0260032 | A1 | 9/2017 | Kadota et al. | |
| 2017/0303449 | A1 | 10/2017 | Tsuge | |

FOREIGN PATENT DOCUMENTS

| | | |
|---|---|---|
| CN | 108861479 A | 11/2018 |
| JP | S63-057404 A | 3/1988 |
| JP | 2000-315891 A | 11/2000 |
| JP | 2005-166878 A | 6/2005 |
| JP | 2010-245241 A | 10/2010 |
| JP | 2015-056414 A | 3/2015 |
| JP | 2017-163004 A | 9/2017 |
| JP | 2019-204908 A | 11/2019 |
| WO | 2020-026931 A1 | 3/2020 |

OTHER PUBLICATIONS

Written Opinion dated Jan. 12, 2021 issued in Patent Application No. PCT/JP2020/041252.

* cited by examiner

TRAY HANDLING DEVICE AND TRAY HANDLING METHOD

TECHNICAL FIELD

The present disclosure relates to a tray handling device and a tray handling method.

BACKGROUND ART

A tray feeder that supplies a component accommodated in a tray to a component mounting device has been known. The tray is mounted on a dedicated pallet, and the pallet on which the tray is mounted is held in a magazine. The tray feeder takes out a necessary tray together with the pallet from the magazine, and supplies the component held in the tray to the component mounting device (for example, Patent Literature 1). By using the pallet, trays of various sizes and shapes can be handled.

CITATION LIST

Patent Literature

Patent Literature 1: JP-A-2015-56414

SUMMARY OF INVENTION

Technical Problem

However, in the related art, work of mounting the tray on the pallet has been manually performed, and automation has not been realized.

An object of the present disclosure is to provide a tray handling device and a tray handling method for automatically mounting a tray on a pallet.

Solution to Problem

A tray handling device according to the present disclosure is a tray handling device configured to handle a tray collected from a component mounting device configured to mount a component, which is held in a tray, on a substrate, and the tray handling device includes: a pallet collecting unit configured to take out a pallet, on which the tray is mounted, from a magazine collected from the component mounting device; and a tray unloading unit configured to unload the tray from the pallet that is collected.

A tray handling device according to the present disclosure is a tray handling device configured to handle a tray used for supplying a component to a component mounting device configured to mount a component on a substrate, and the tray handling device includes: a pallet storing unit configured to supply a pallet; and a tray mounting unit configured to mount a tray, in which a component is held, on the pallet that is supplied.

A tray handling device according to the present disclosure is a tray handling device configured to handle a tray used for supplying a component to a component mounting device configured to mount the component on a substrate, and the tray handling device includes: a tray unloading unit configured to unload the tray from a pallet collected from the component mounting device; and a tray mounting unit configured to mount a tray, which holds a component, on the pallet.

A tray handling method according to the present disclosure is a tray handling method for handling a tray used for supplying a component to a component mounting device configured to mount the component on a substrate, and the tray handling method includes: a tray unloading step of unloading the tray from a pallet collected from the component mounting device; and a tray mounting step of mounting a tray, which holds a component, on the pallet from which the tray is unloaded.

Advantageous Effects of Invention

According to the present disclosure, the tray can be automatically mounted onto the pallet.

DESCRIPTION OF EMBODIMENTS

Figure 1:
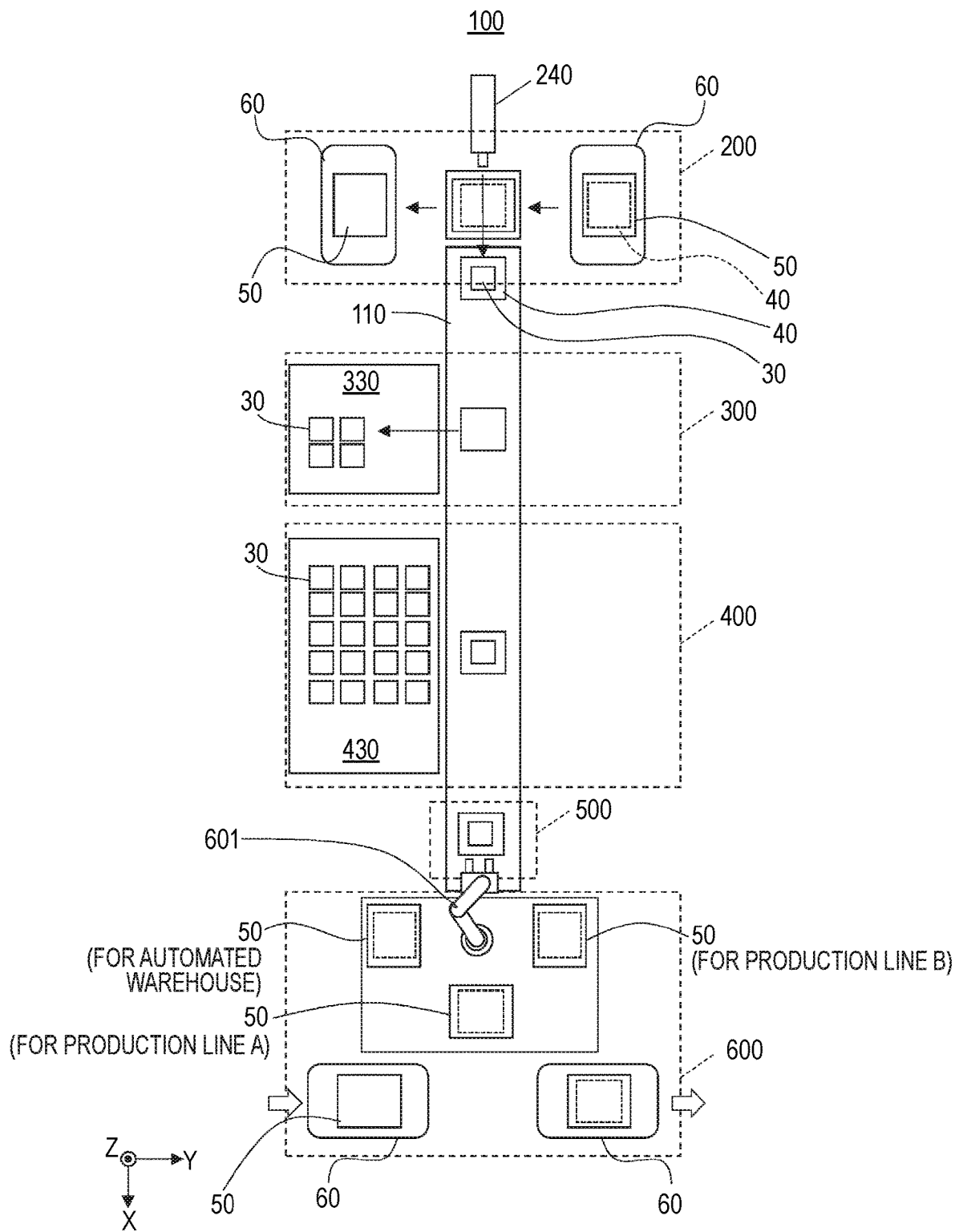
FIG. 1 is a diagram showing an example of an overall configuration of a tray handling device according to the present embodiment, and is a diagram in which the tray handling device is viewed from above.

Hereinafter, an embodiment of the present disclosure will be described in detail with reference to the drawings as appropriate. However, an unnecessarily detailed description may be omitted. For example, detailed descriptions of well-known matters and redundant descriptions of substantially the same configurations may be omitted. This is to avoid unnecessary redundancy in the following description and to facilitate understanding for those skilled in the art. It should be noted that the accompanying drawings and the following description are provided for those skilled in the art to fully understand the present disclosure, and are not intended to limit the subject matter described in the claims. In the illustration of the drawings, an axis extending from the top to the bottom of the drawing is defined as an X axis, an axis extending from the left to the right of the drawing is defined as a Y axis, and an axis extending from the back to the front of the drawing is defined as a Z axis. Further, a positive direction of the X axis is referred to as "front", a negative direction of the X axis is referred to as "rear", a positive direction of the Y axis is referred to as "right", a negative direction of the Y axis is referred to as "left", a positive direction of the Z axis is referred to as "up", and a negative direction of the Z axis is referred to as "down". The expressions related to these directions are used for convenience of description and are not intended to limit the posture of the structure in actual use.

Present Embodiment

<Overall Configuration of Tray Handling Device>

FIG. 1 is a diagram showing an example of an overall configuration of a tray handling device 100 according to the present embodiment, and is a diagram in which the tray handling device 100 is viewed from above. Next, an outline of a configuration of the tray handling device 100 will be described with reference to FIG. 1.

In a factory, a component mounting device 10 (see FIG. 2) that mounts a component on a substrate and a tray component supply device 20 (see FIG. 2) that supplies a component held in a tray 30 to the component mounting device 10 are provided (not shown in FIG. 1). The tray component supply device 20 may be replaced with another term such as a tray feeder. The tray 30 is mounted on a dedicated pallet 40. The pallet 40 on which the tray 30 is mounted is held in a magazine 50. The magazine 50 is delivered to a predetermined place by an AGV 60 traveling in the factory. The AGV 60 may be replaced with another term such as an automated guided vehicle. Details of the component mounting device 10 and the tray component supply device 20 will be described later (see FIG. 2).

The tray handling device 100 according to the present embodiment is a device that is provided in a factory and handles the tray 30. Specifically, the tray handling device 100 is a device that automatically performs a process of unloading the tray 30 from the pallet 40 or mounting the tray 30 on the pallet 40.

The tray handling device 100 includes a conveyor 110, a pallet collecting unit 200, a tray unloading unit 300, a tray mounting unit 400, an information writing unit 500, and a pallet dispensing unit 600.

For example, after a component on a tray 30 is supplied by the tray component supply device 20, the AGV 60 collects the magazine 50 holding the pallet 40 on which the tray 30 is mounted, and delivers the magazine 50 to a place of the pallet collecting unit 200. Hereinafter, the pallet 40 on which the tray 30 is mounted is referred to as a tray-mounted pallet 40. In the tray 30 of the tray-mounted pallet 40, a component may be held or may not be held.

The pallet collecting unit 200 is a device and an area that perform work of collecting the tray-mounted pallet 40 from the magazine 50 delivered by the AGV 60 and placing the collected tray-mounted pallet 40 on the conveyor 110. Details of the pallet collecting unit 200 will be described later (see FIG. 5).

The tray unloading unit 300 is a device and an area that perform work of unloading the tray 30 from the tray-mounted pallet 40 conveyed by the conveyor 110 and collecting the tray 30 in the tray collecting unit 330. The pallet 40 from which the tray 30 has been unloaded is conveyed by the conveyor 110. Details of the tray unloading unit 300 will be described later (see FIGS. 7A and 7B).

The tray mounting unit 400 is a device and an area that perform work of acquiring the tray 30 stocked in a tray stock unit 430 and mounting the acquired tray 30 on the pallet 40 conveyed by the conveyor 110. The tray stock unit 430 is a device or an area that stocks the tray 30 holding the components. The tray-mounted pallet 40 holding the component is conveyed by the conveyor 110. Details of the tray mounting unit 400 will be described later (see FIG. 13).

The information writing unit 500 is a device and an area that perform work of writing identification information of the pallet 40 (hereinafter, referred to as "pallet identification information") and/or information on the component held in the tray 30 on the pallet 40 (hereinafter, referred to as "component information") to a wireless tag 44 (see FIG. 3) of the pallet 40 on which the tray 30 holding the component is mounted. Details of the information writing unit 500 will be described later (see FIG. 15).

The pallet dispensing unit 600 is a device and an area for performing work of disposing the tray-mounted pallet 40, the information of which has been written in the wireless tag 44 by the information writing unit 500, in the magazine 50. In addition, the pallet dispensing unit 600 performs work of placing, on the AGV 60, a magazine (hereinafter, referred to as an "holding magazine") 50 which holds the tray-mounted pallet 40. Details of the pallet dispensing unit 600 will be described later (see FIG. 15). For example, the AGV 60 places the holding magazine 50 and moves to a place of the tray component supply device 20.

According to the configuration of the tray handling device 100 shown in FIG. 1, it is possible to automate the work of unloading the tray 30 from the pallet 40 and mounting the tray 30 to the pallet 40. This will be described in detail below.

<Configuration of Component Mounting Device and Component Supply Device>

Figure 2:
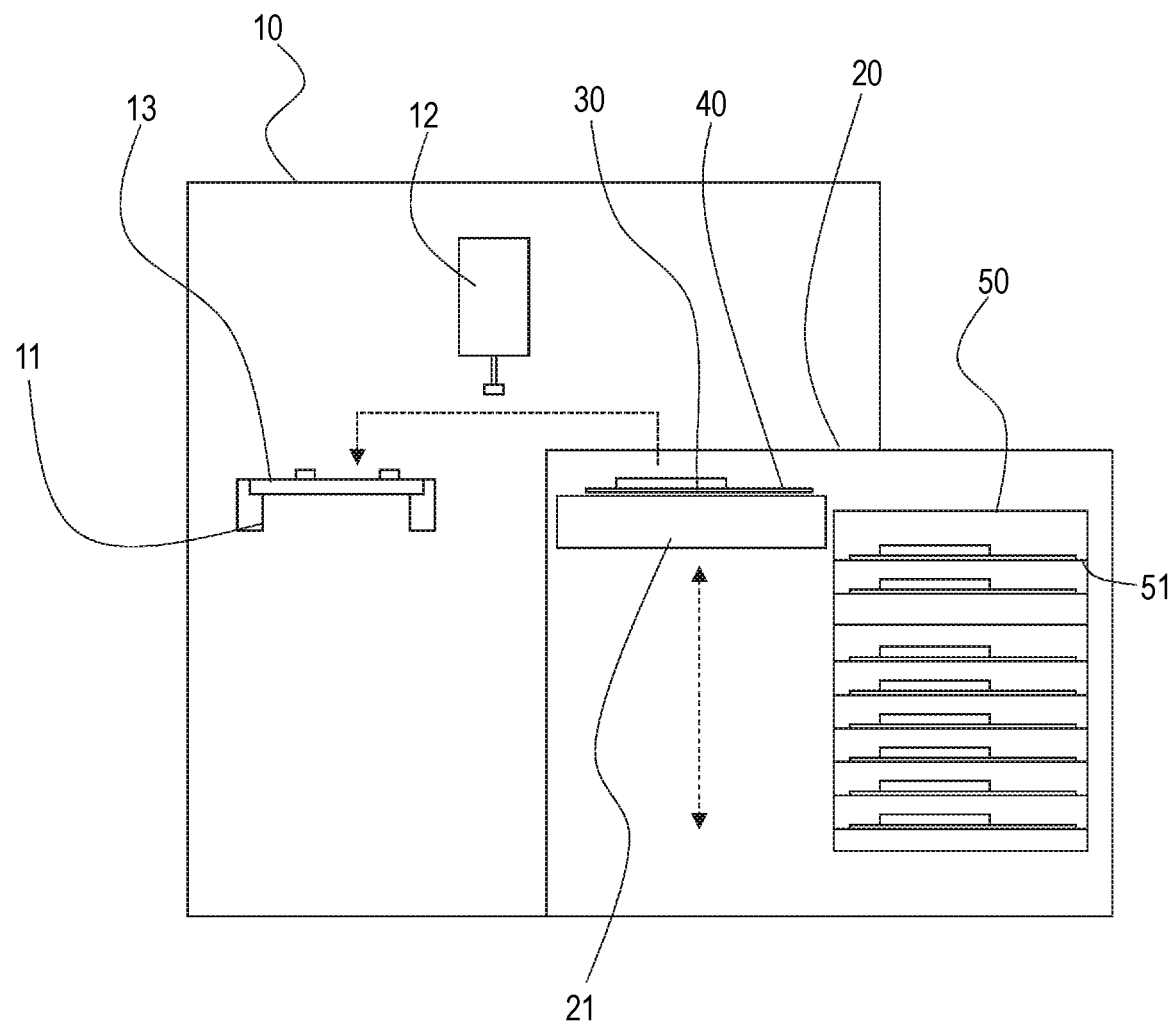
FIG. 2 is a schematic diagram showing a configuration example of a component mounting device and a tray component supply device.

FIG. 2 is a schematic diagram showing a configuration example of the component mounting device 10 and the tray component supply device 20. Next, the component mounting device 10 and the tray component supply device 20 will be described in detail with reference to FIG. 2.

As shown in FIG. 2, the component mounting device 10 includes a substrate conveyance unit 11 and a component mounting head 12. The substrate conveyance unit 11 is a device that conveys a substrate 13, and includes, for example, a belt, a chain, a roller, or the like. The substrate conveyance unit 11 may be replaced with another term such as a conveyor. The component mounting head 12 is a device that performs work of mounting a component supplied by the tray component supply device 20 on the substrate 13 conveyed by the substrate conveyance unit 11.

The tray component supply device 20 includes a mechanism to which the magazine 50 can be attached and from which the magazine 50 can be detached, and a pallet moving device 21 that can be lifted and lowered by a lifting mechanism. The tray component supply device 20 is attachable to and detachable from the component mounting device 10.

The component mounting device 10 and the tray component supply device 20 perform, for example, the following operations.

(S11) The pallet moving device 21 moves to a position at a height that is the same as that of one support rail 51 in the magazine 50, and pulls out the tray-mounted pallet 40 held on the support rail 51 at the position at the height. Then, the pallet moving device 21 places the tray-mounted pallet 40 thereon and moves to a position having a predetermined height (for example, the highest position).

(S12) The component mounting head 12 sucks a component from the tray 30 of the tray-mounted pallet 40 placed on the pallet moving device 21, and mounts the component on the substrate 13.

(S13) When mounting of one or a plurality of components on the substrate 13 is completed, the substrate conveyance unit 11 conveys the substrate 13 to a working device of the next step.

(S14) When there is no component in the tray 30, the pallet moving device 21 places the tray-mounted pallet 40 thereon and moves to a position having the same height as the empty support rail 51 in the magazine 50, and the tray-mounted pallet 40 is held on the support rail 51.

When setup change is performed, for example, in a case where the magazine 50 is filled with the tray-mounted pallet 40 or in a case where production of a substrate 13 of a different model is started, the magazine 50 of the tray component supply device 20 may be replaced with another magazine 50. In this case, the replacement magazine 50 may be delivered by the AGV 60.

<Positioning of Tray>

Figure 3:
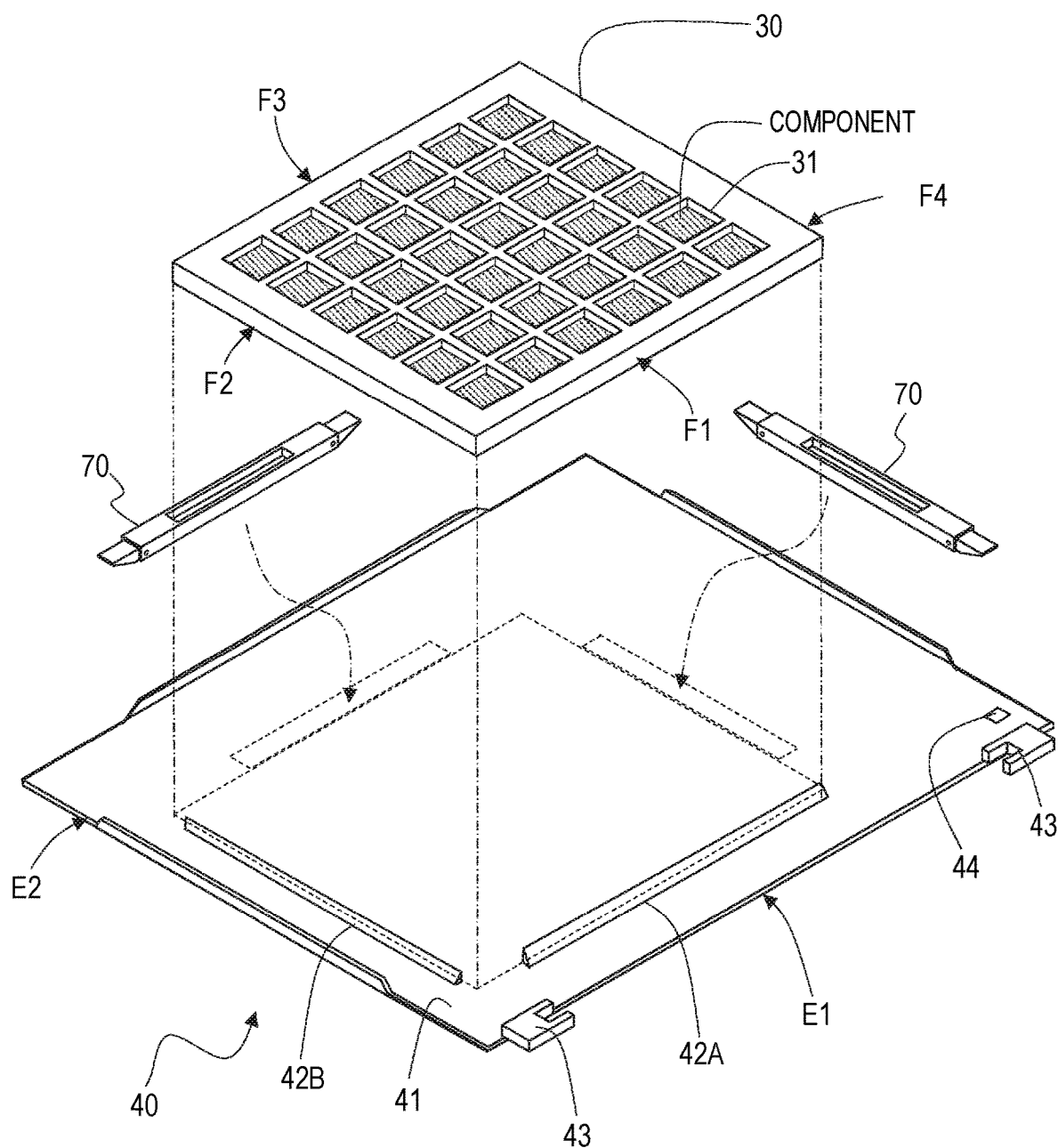
FIG. 3 is a perspective view showing a configuration example of a tray and a pallet.
Figure 4:
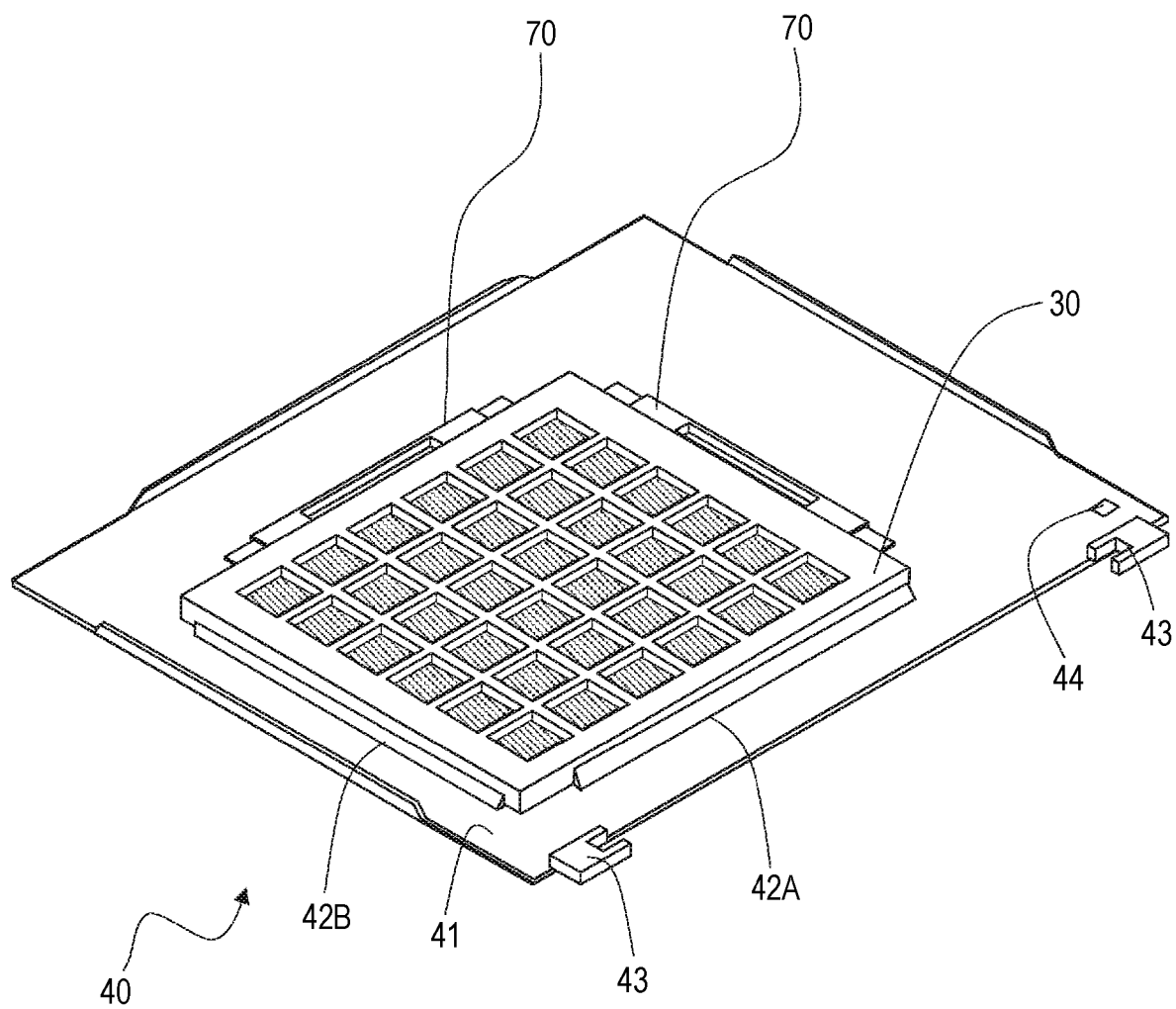
FIG. 4 is a perspective view showing an example of a state after the tray is positioned relative to the pallet.

FIG. 3 is a perspective view showing a configuration example of the tray 30 and the pallet 40. FIG. 4 is a perspective view showing an example of a state after the tray 30 is positioned relative to the pallet 40. Next, the configurations of the tray 30 and the pallet 40 and the positioning of the tray 30 on the pallet 40 will be described in detail with reference to FIGS. 3 and 4.

The tray 30 has a substantially rectangular thin shape. A plurality of recessed portions 31 are formed on an upper surface of the tray 30, and components are held in the respective recessed portions 31. The tray 30 is made of, for example, resin.

The pallet 40 includes a pallet body 41, tray positioning pieces 42A and 42B, an engagement portion 43, and the wireless tag 44.

The pallet body 41 has a substantially rectangular flat plate shape. The pallet body 41 is made of a magnetic material.

The engagement portion 43 is a member that is provided on a front side E1 of the pallet body 41 and engages with the pallet moving device 21 of the tray component supply device 20. The pallet moving device 21 is engaged with the engagement portion 43, and can pull out the pallet 40 from the magazine 50 or dispose the pallet 40 in the magazine 50.

The tray positioning pieces 42A and 42B have an elongated protrusion shape and are provided on an upper surface of the pallet body 41. For example, the tray positioning piece 42A is provided parallel to the front side E1 of the pallet body 41, and the tray positioning piece 42B is provided parallel to a left side E2 of the pallet body 41. Therefore, the tray 30 can be positioned relative to the pallet 40 by bringing a front side F1 and a left side F2 of the tray 30 into contact with the tray positioning pieces 42A and 42B, respectively.

In order to fix the position of the tray 30, a magnet bar 70, which is an example of a tray fixing member, is used. The magnet bar 70 has a substantially rod shape. The magnet bar 70 includes a magnet portion 72 (see FIGS. 10A and 10B) on a lower surface thereof. Details of the magnet bar 70 will be described later (see FIGS. 10A and 10B).

After the tray 30 is positioned by the tray positioning pieces 42A and 42B, as shown in FIG. 3, two magnet bars 70 are disposed on the pallet 40 so as to abut against (contact) the remaining two sides (a rear side F3 and a right side F4 in FIG. 3) of the tray 30, respectively. Since the pallet 40 is made of a magnetic material, the two magnet bars 70 are firmly fixed to the upper surface of the pallet 40. Accordingly, as shown in FIG. 4, the tray 30 is fixed in all sides and is not displaced in an XY plane direction of the pallet 40.

The wireless tag 44 is a circuit in which information can be read and written wirelessly, and includes a storage unit in which information can be read and written. The wireless tag 44 is provided, for example, at an end of the upper surface of the pallet body 41. Information is written into the wireless tag 44 by the information writing unit 500. Details of the writing of information to the wireless tag 44 will be described later (see FIG. 15).

<Configuration of Magazine>

Figure 5:
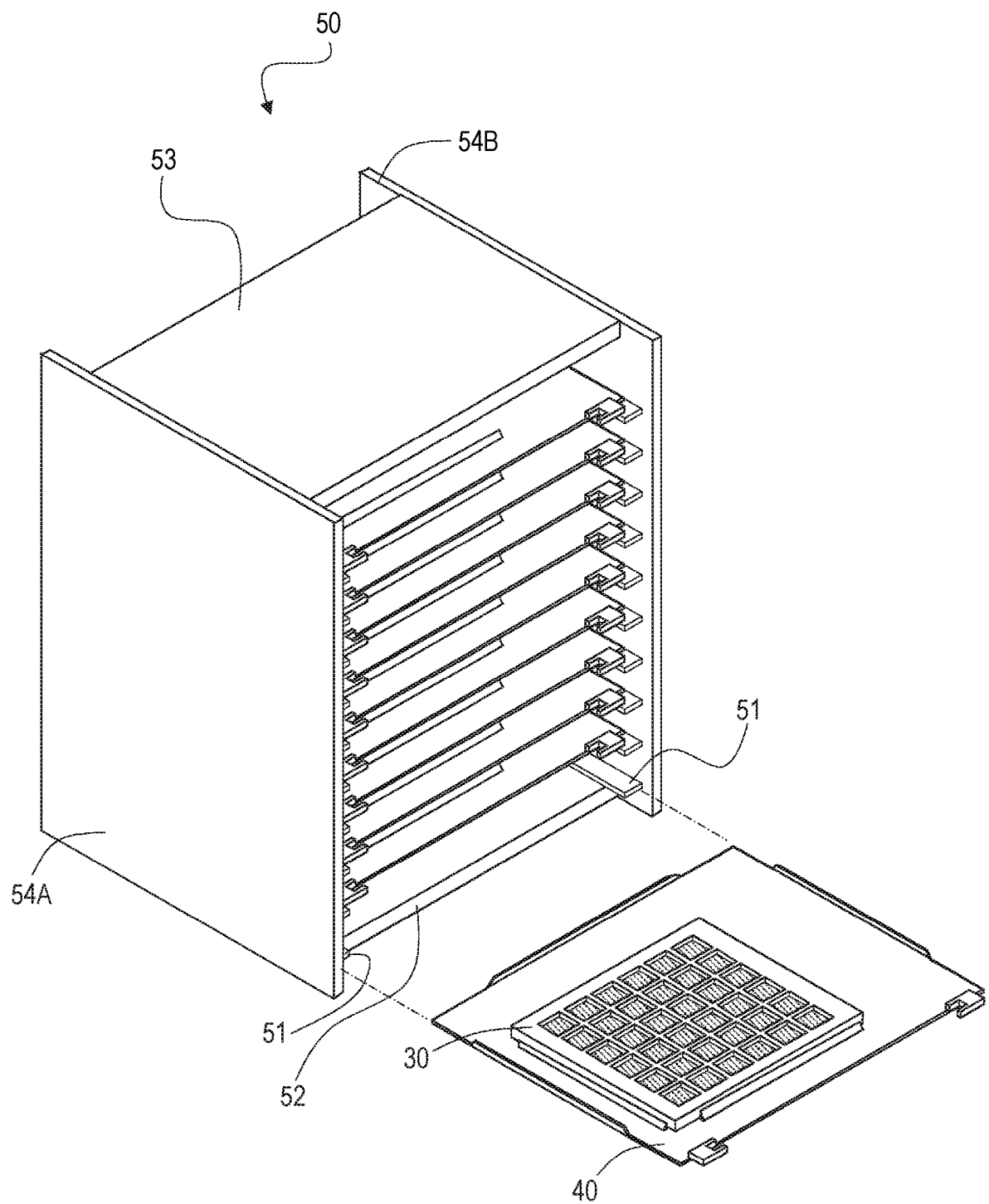
FIG. 5 is a perspective view showing a configuration example of a magazine.

FIG. 5 is a perspective view showing a configuration example of the magazine 50. Next, the configuration of the magazine 50 will be described in detail with reference to FIG. 5.

The magazine 50 has a substantially rectangular parallelepiped shape, and includes a bottom plate 52, a top plate 53, a left side plate 54A, and a right side plate 54B. That is, a front side and a rear side of the magazine 50 are opened.

Each of the left side plate 54A and the right side plate 54B is provided with a plurality of support rails 51 which is parallel to the bottom plate 52, and each corresponding two of which are provided at positions having the same height. A pair of left and right support rails 51 support one tray-mounted pallet 40. That is, the magazine 50 accommodate tray-mounted pallets 40, the number of which corresponds to the number of the pair of left and right support rails 51.

<Configuration and Operation of Pallet Collecting Unit>

Figure 6:
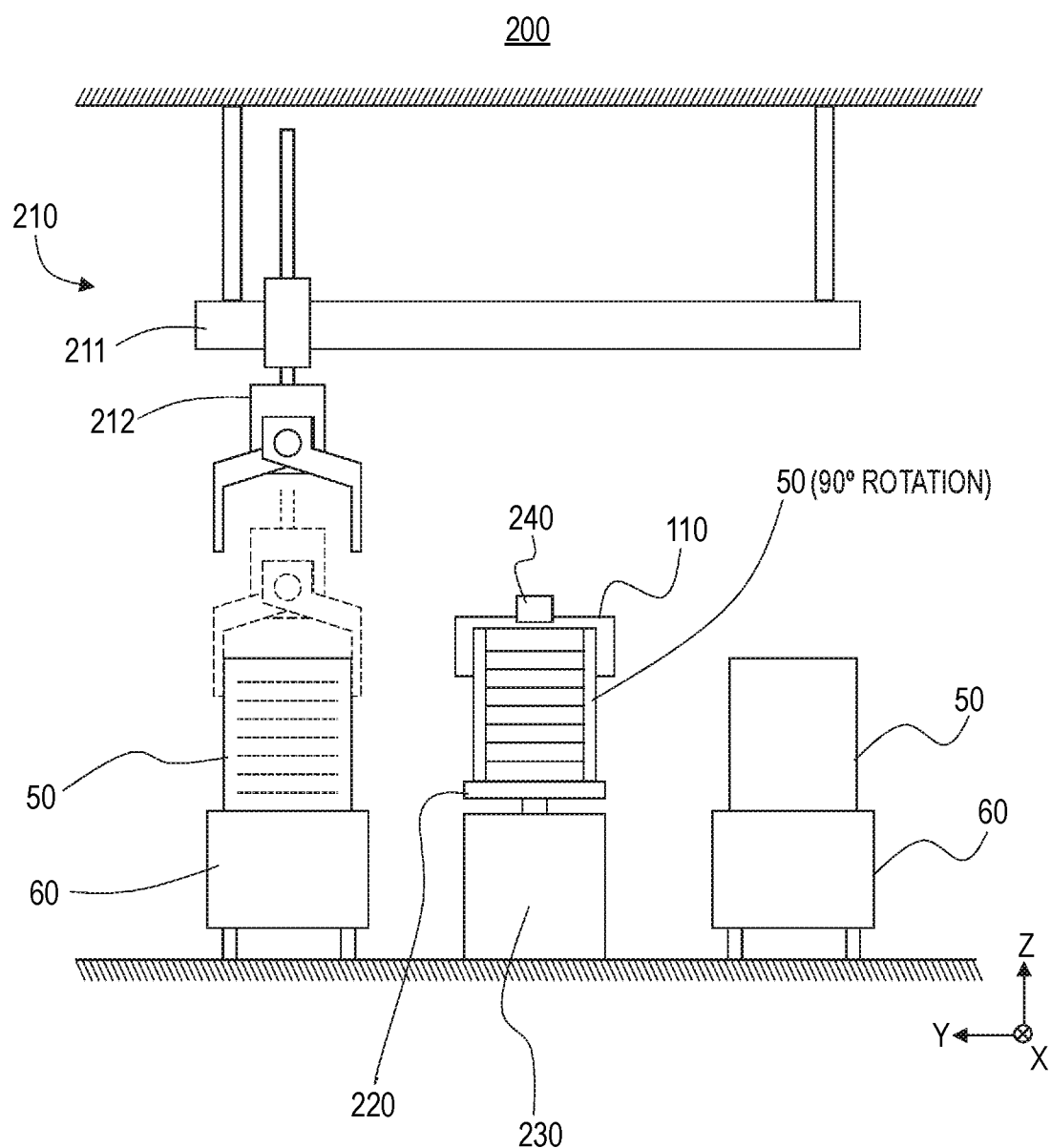
FIG. 6 is a schematic diagram showing a configuration example of a pallet collecting unit.

FIG. 6 is a schematic diagram showing a configuration example of the pallet collecting unit 200. Next, the configuration and operation of the pallet collecting unit 200 will be described in detail with reference to FIG. 6.

The pallet collecting unit 200 includes a magazine conveying device 210, a pallet collecting stage 220, a drive unit 230, and a pallet pushing device 240.

The magazine conveying device 210 is a device that transports the magazine 50. The magazine conveying device 210 includes an XY table 211 that is movable in an XY axis direction, and an end effector 212 that is connected to the XY table 211 and movable in a Z axis direction. The end effector 212 includes a mechanism by which the magazine 50 can be gripped from above.

The pallet collecting stage 220 is a stage on which the magazine 50 is placed. The pallet collecting stage 220 is provided on the drive unit 230.

The drive unit 230 is a device that lifts and lowers the pallet collecting stage 220. In addition, the drive unit 230 is a device that rotates the pallet collecting stage 220 by 90 degrees.

The pallet pushing device 240 is a device that pushes out the pallet 40 in the magazine 50 toward the conveyor 110.

The pallet collecting unit 200 performs, for example, the following operations.

(S21) The AGV 60 on which the magazine 50 holding the tray-mounted pallet 40 is placed arrives next to the pallet collecting stage 220.

(S22) In the magazine conveying device 210, the XY table 211 and the end effector 212 are driven to lift up the magazine 50 on the AGV 60, and the lifted-up magazine 50 is placed on the pallet collecting stage 220.

(S23) The drive unit 230 rotates the pallet collecting stage 220 by 90 degrees. Accordingly, a front surface of the magazine 50 is changed from a Y-axis direction to an X-axis direction.

(S24) The drive unit 230 lifts (or lowers) the pallet collecting stage 220 so that one tray-mounted pallet 40 in the magazine 50 comes to a position having a height equal to that of the pallet pushing device 240.

(S25) The pallet pushing device 240 pushes out the tray-mounted pallet 40 at the position from the magazine 50. The pushed-out tray-mounted pallet 40 is placed on the conveyor 110. Details of the operation of the pallet pushing device 240 will be described later (see FIGS. 7A and 7B).

(S26) The drive unit 230 and the pallet pushing device 240 repeat S24 and S25 until all the tray-mounted pallets 40 in the magazine 50 are pushed out.

(S27) The magazine conveying device 210 lifts up the magazine 50 from which all the tray-mounted pallets 40 are pushed out, and the magazine conveying device 210 places the lifted-up magazine 50 on the AGV 60. In this case, some of the tray-mounted pallets 40 may remain in the magazine 50.

Figure 7A:
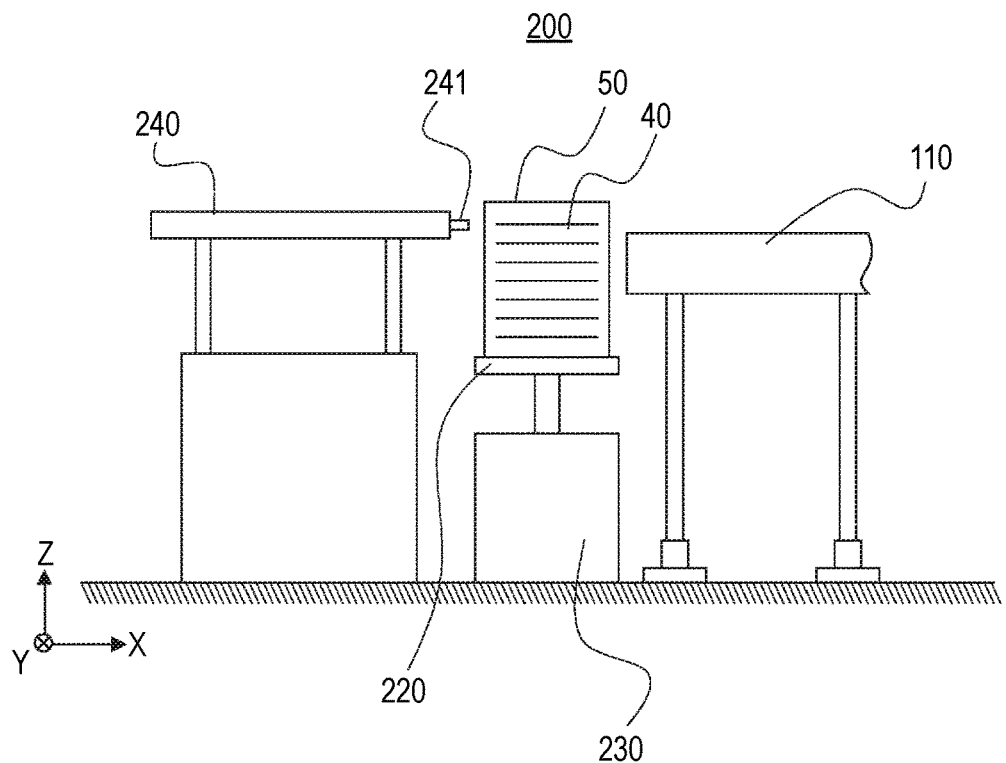
FIG. 7A is a schematic diagram showing an example of a state before a pallet pushing device pushes out the pallet in the magazine.
Figure 7B:
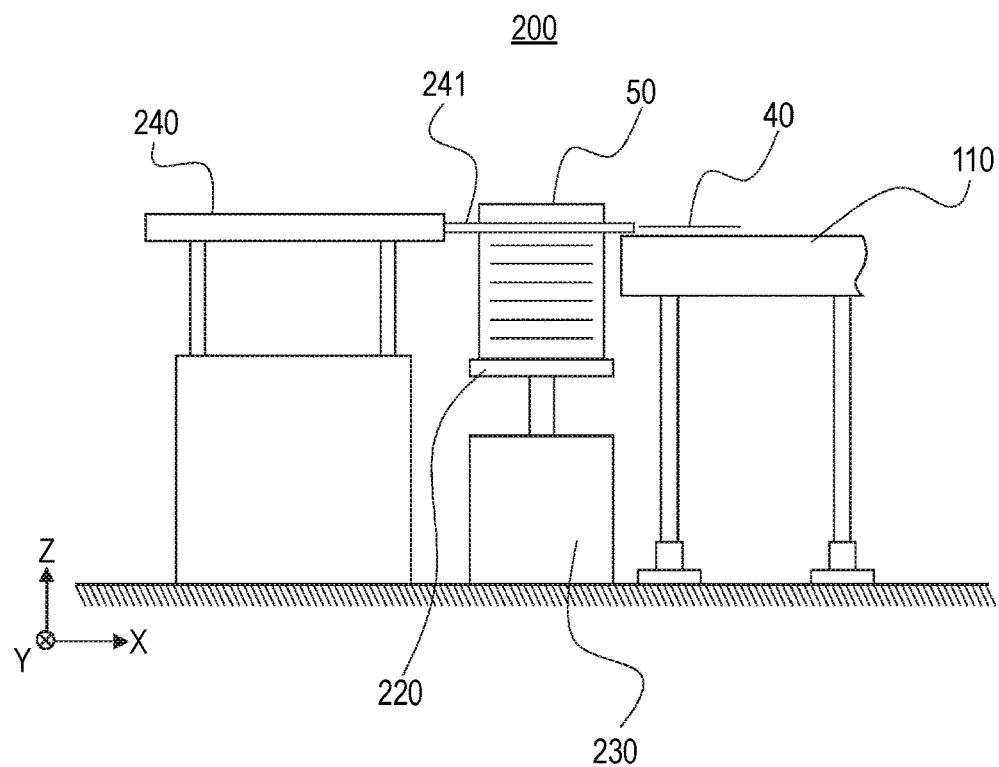
FIG. 7B is a schematic diagram showing an example of a state after the pallet pushing device pushes out the pallet in the magazine.

FIG. 7A is a schematic diagram showing an example of a state before the pallet pushing device 240 pushes out the pallet 40 in the magazine 50. FIG. 7B is a schematic diagram showing an example of a state after the pallet pushing device 240 pushes out the pallet 40 in the magazine 50. Next, the operations of S24 and S25 in FIG. 6 will be described in detail with reference to FIGS. 7A and 7B.

The pallet pushing device 240 includes a rod-shaped pusher 241 that is slidable in the X-axis direction.

As shown in FIG. 7A, in the above S24, the pusher 241 is located at a position having the same height as one tray-mounted pallet 40.

As shown in FIG. 7B, in the above S25, the pallet pushing device 240 slides the pusher 241 toward the pallet 40 (in the positive direction of the X axis). As a result, the tray-mounted pallet 40 having the same height as the pusher 241 is pushed out by the pusher 241 and placed on the conveyor 110.

<Configuration and Operation of Tray Unloading Unit>

Figure 8:
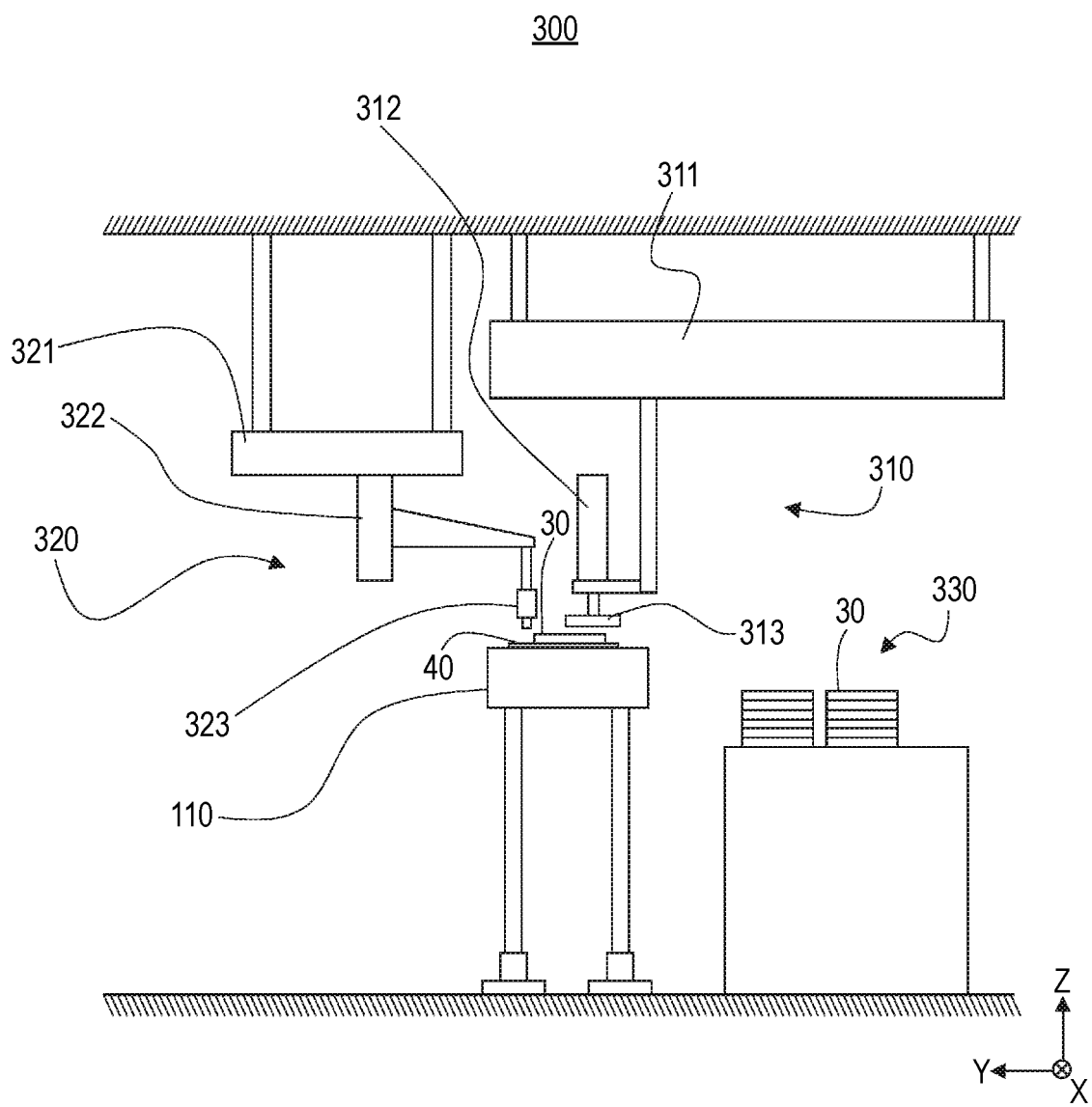
FIG. 8 is a schematic diagram showing a configuration example of a tray unloading unit.
Figure 9:
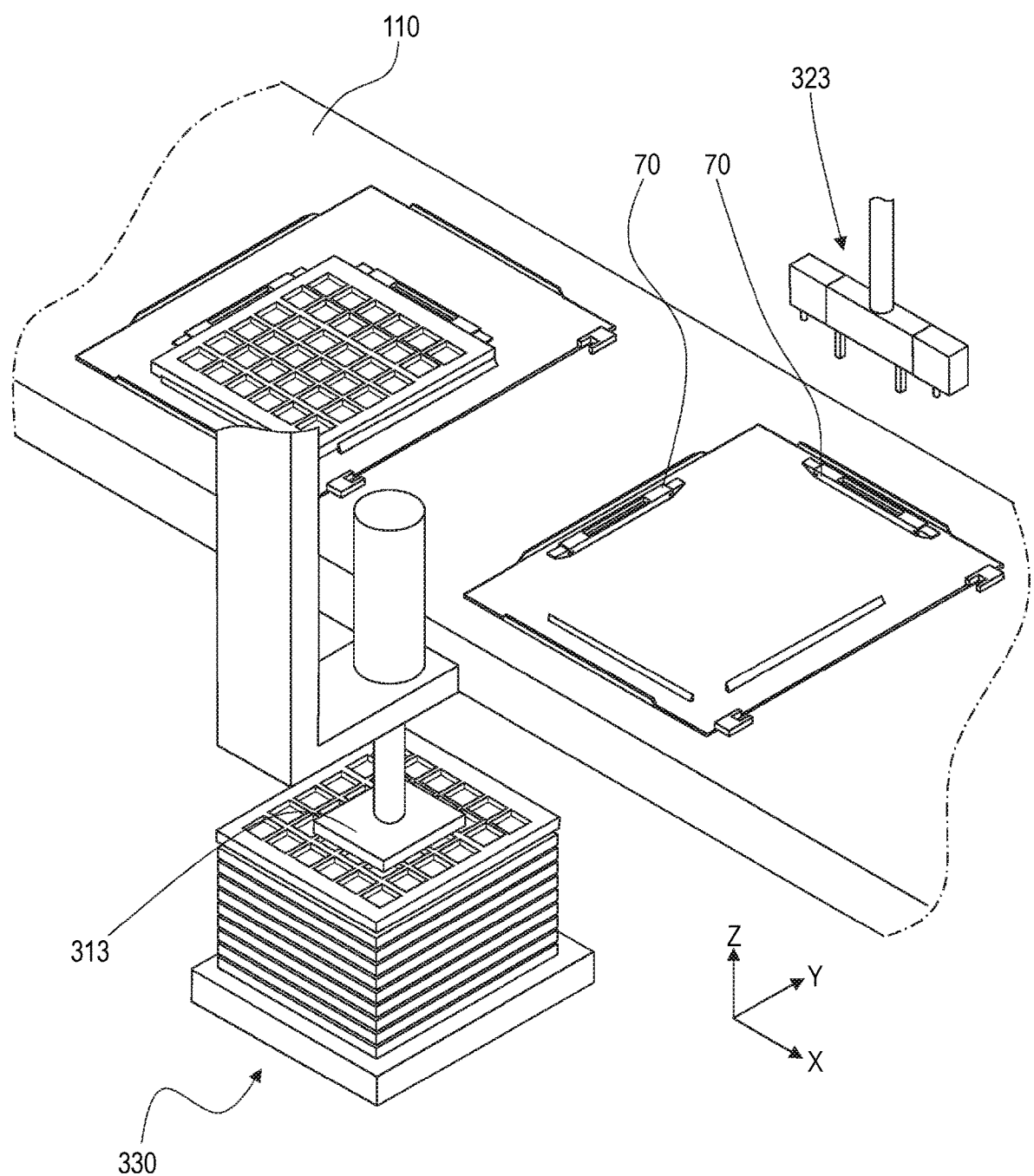
FIG. 9 is a main part perspective view showing a configuration example of the tray unloading unit.

FIG. 8 is a schematic diagram showing a configuration example of the tray unloading unit 300. FIG. 9 is a main part perspective view showing a configuration example of the tray unloading unit 300. Next, the configuration and operation of the tray unloading unit 300 will be described in detail with reference to FIGS. 8 and 9.

The tray unloading unit 300 includes a tray removing unit 310, a magnet bar removing device 320, and a tray collecting unit 330.

The tray removing unit 310 is a device that removes the tray 30 from the pallet 40. The tray removing unit 310 includes an XY table 311 that is movable in the XY axis direction, a lifting unit 312 that is connected to the XY table 311 and movable in the Z axis direction, and a tray suction head 313 that is connected to the lifting unit 312 and can suck the tray 30.

The magnet bar removing device 320 is an example of a releasing unit that releases the state in which the tray 30 is fixed to the pallet 40. For example, the magnet bar removing device 320 is a device that removes the magnet bars 70 from the pallet 40. The magnet bar removing device 320 includes an XY table 321 that is movable in the XY axis direction, a Z table 322 that is connected to the XY table 321 and movable in the Z axis direction, and a magnet bar transfer head 323 that is connected to the Z table 322 and can transfer the magnet bars 70.

The tray collecting unit 330 is a device or a place on which the tray 30 collected from the pallet 40 is placed.

The tray unloading unit 300 performs, for example, the following operation.

(S31) As shown in FIG. 9, in the magnet bar removing device 320, the XY table 321, the Z table 322, and the magnet bar transfer head 323 are driven to unload the magnet bars 70 from the pallet 40 conveyed by the conveyor 110, and the magnet bars 70 are placed at a predetermined position away from the tray 30 on the pallet 40. Details of the operation of the magnet bar transfer head 323 will be described later (see FIG. 11).

(S32) As shown in FIG. 9, in the tray removing unit 310, the XY table 311, the lifting unit 312, and the tray suction head 313 are driven to suck the tray 30 on the pallet 40 to the tray suction head 313, and the sucked tray 30 is transferred to the tray collecting unit 330.

<Configuration of Magnet Bar>

Figure 10A:
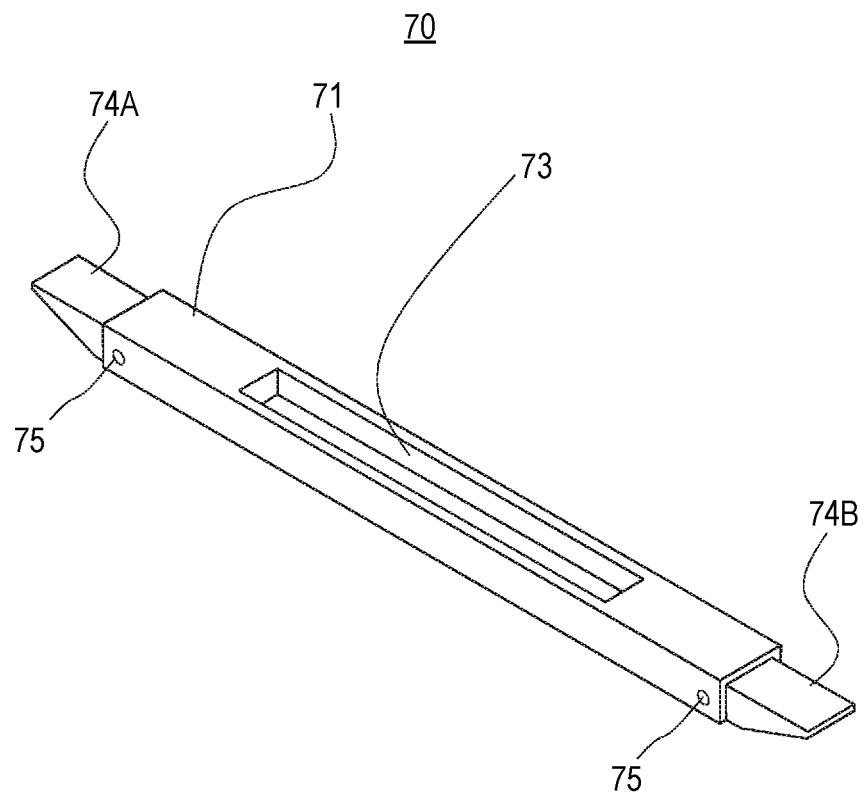
FIG. 10A is a perspective view showing a configuration example of a magnet bar.
Figure 10B:
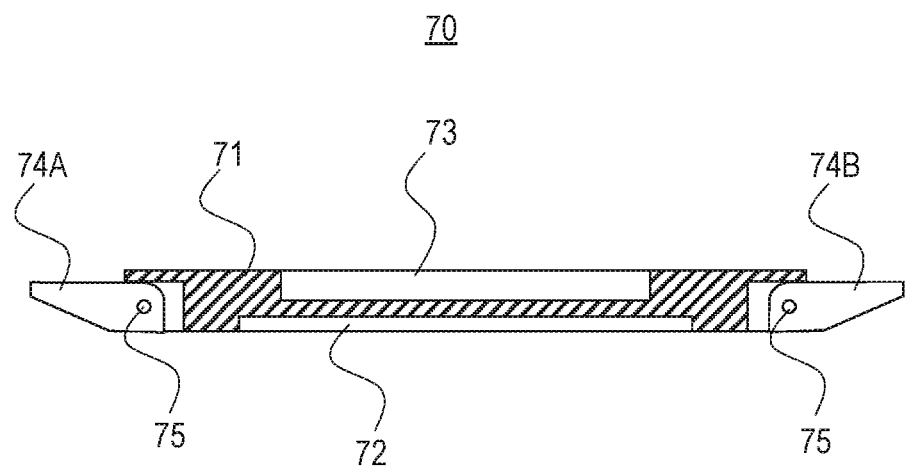
FIG. 10B is a vertical sectional view in a longitudinal direction showing a configuration example of the magnet bar.

FIG. 10A is a perspective view showing a configuration example of the magnet bar 70. FIG. 10B is a longitudinal sectional view in a longitudinal direction showing a configuration example of the magnet bar 70. Next, a structure of the magnet bar 70 will be described in detail with reference to FIGS. 10A and 10B.

The magnet bar 70 includes a body portion 71, a magnet portion 72, a recessed portion 73, lever portions 74A and 74B, and a shaft portion 75.

The body portion 71 has a substantially rod shape that is horizontally long. The magnet portion 72 is provided on a lower surface of the body portion 71 and is attracted to the upper surface of the pallet 40. The recessed portion 73 is formed in the longitudinal direction on an upper surface of the body portion 71.

The lever portions 74A and 74B are respectively attached to both ends of the body portion 71 by shaft portions 75. Each of the lever portions 74A and 74B has an inclined shape in which a lower surface approaches an upper surface toward a distal end on a side far from a corresponding one of the shaft portions 75. The lever portions 74A and 74B are swingable about the shaft portion 75.

<Configuration and Operation of Magnet Bar Transfer Head>

Figure 11:
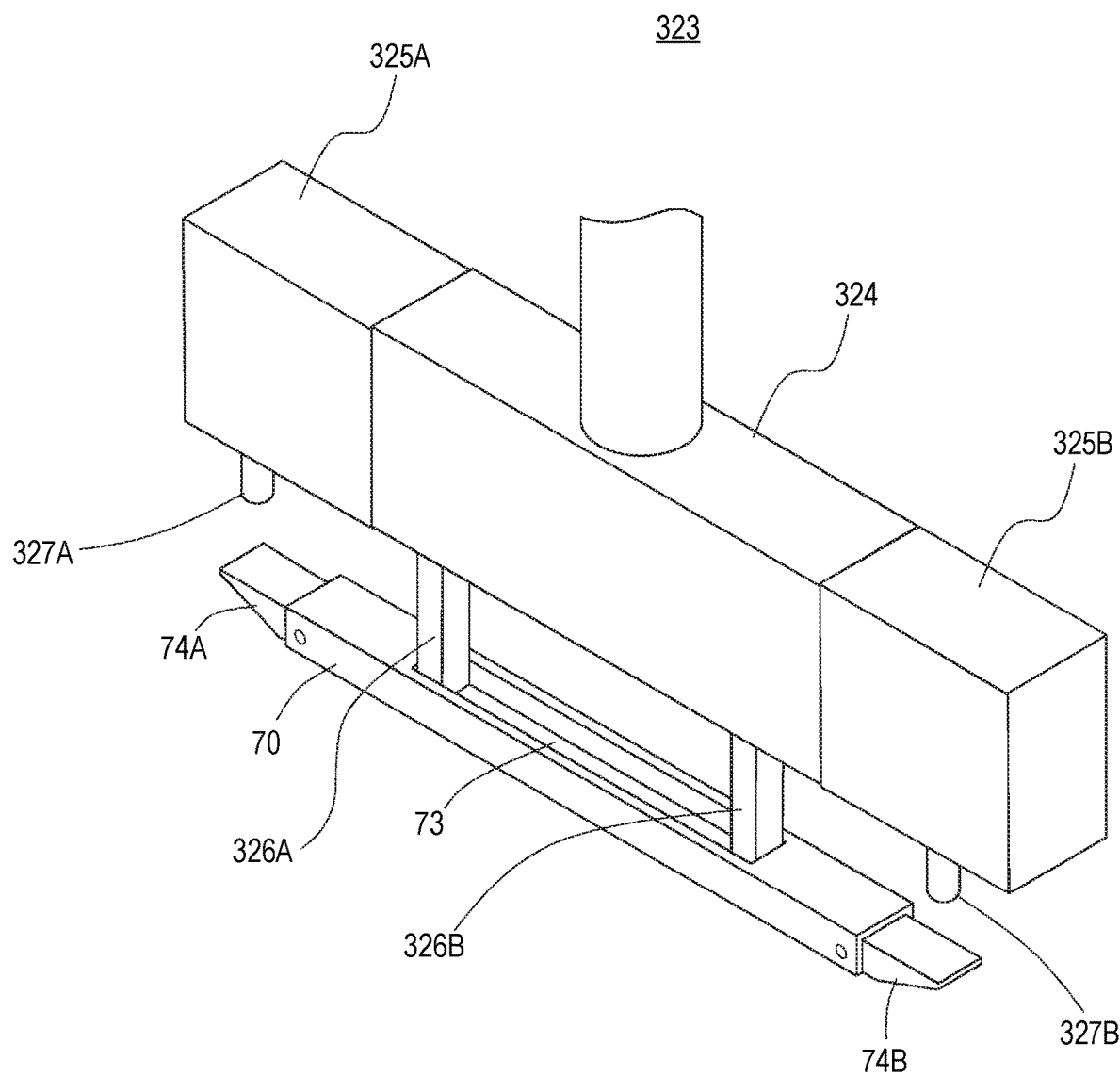
FIG. 11 is a perspective view showing a configuration example of a magnet bar transfer head.

FIG. 11 is a perspective view showing a configuration example of the magnet bar transfer head 323. Next, a configuration of the magnet bar transfer head 323 will be described in detail with reference to FIG. 11.

The magnet bar transfer head 323 has a substantially rectangular parallelepiped shape that is horizontally long. The magnet bar transfer head 323 includes a holding portion 324, lever operation portions 325A and 325B, pins 326A and 326B, and rods 327A and 327B.

The holding portion 324 constitutes a vicinity of a center of the magnet bar transfer head 323. An upper surface of the holding portion 324 is connected to the Z table 322 of the magnet bar removing device 320.

The pins 326A and 326B have a rod shape extending downward from a lower surface of the holding portion 324. The pins 326A and 326B have a thickness and a shape that allow the pins 326A and 326B to be inserted into the recessed portion 73 of the magnet bar 70. In the magnet bar transfer head 323, the pins 326A and 326B can be moved in the longitudinal direction, so that the interval between the pins 326A and 326B can be reduced or increased.

The lever operation portions 325A and 325B are respectively connected to both ends of the holding portion 324 in the longitudinal direction.

The rods 327A and 327B have rod shapes that can extend and contract downward from lower surfaces of the lever operation portions 325A and 325B, respectively. Positions of the rods 327A and 327B correspond to positions of the lever portions 74A and 74B of the magnet bar 70, respectively. That is, an interval between the rod 327A and the rod 327B corresponds to an interval between the lever portion 74A and the lever portion 74B of the magnet bar 70.

Figure 12:
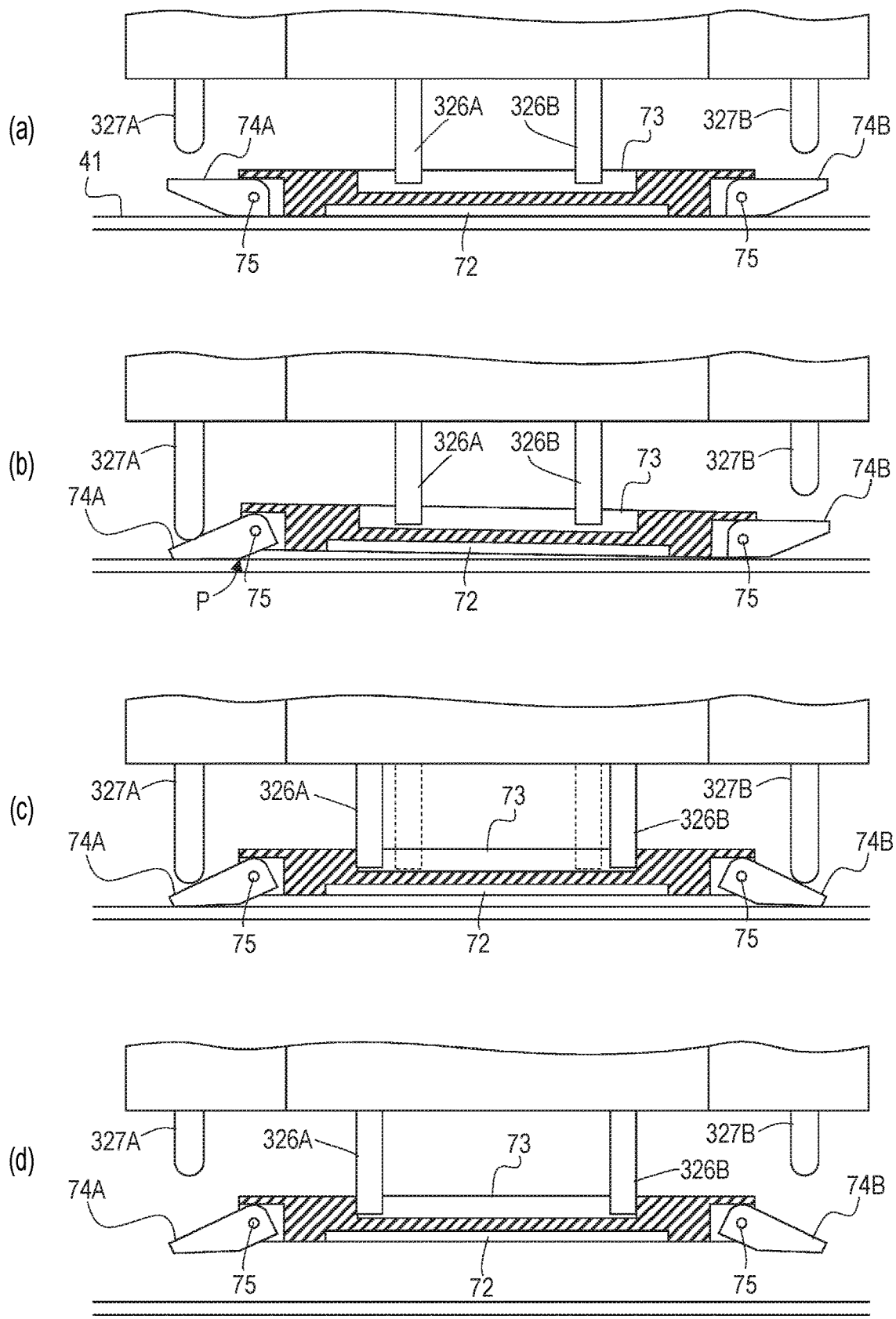
FIG. 12 illustrates an operation of the magnet bar transfer head.

FIG. 12 illustrates an operation of the magnet bar transfer head 323. Next, an operation in which the magnet bar transfer head 323 transfers the magnet bar 70 will be described in detail with reference to FIG. 12.

(S31) As shown in (a) of FIG. 12, in the magnet bar transfer head 323, distal ends of the pins 326A and 326B are inserted into the recessed portion 73 of the magnet bar 70.

(S32) As shown in (b) of FIG. 12, in the magnet bar transfer head 323, the rod 327A extends downward to press a distal end of the lever portion 74A of the magnet bar 70 from above. Accordingly, according to the principle of leverage, the distal end of the lever portion 74A serves as a force application point, a portion P of the inclined lower surface of the lever portion 74A near the shaft portion 75 serves as a fulcrum, and the shaft portion 75 of the lever portion 74A serves as a point of action, so that the body portion 71 of the magnet bar 70 is pushed up. Therefore, an attraction force of the magnet portion 72 of the magnet bar 70 is weakened.

(S33) As shown in (c) of FIG. 12, in the magnet bar transfer head 323, the rod 327B extends downward to press the lever portion 74B of the magnet bar 70 from above. Accordingly, the body portion 71 of the magnet bar 70 is pushed up in the same manner as described above. Therefore, the attraction force of the magnet portion 72 of the magnet bar 70 is further weakened. In addition, since the pins 326A and 326B are inserted into the recessed portion 73 of the magnet bar 70 in S31, the magnet bar 70 is not displaced or flipped even when the operations of S32 and S33 are performed. Therefore, when the magnet bar 70 is removed, the components in the tray 30 are not scattered.

(S34) As shown in (c) of FIG. 12, in the magnet bar transfer head 323, the interval between the pins 326A and 326B is widen until the pins 326A and 326B respectively come into contact with ends of the recessed portion 73.

(S35) As shown in (d) of FIG. 12, the magnet bar transfer head 323 is lifted with the interval between the pins 326A and 326B widened. Accordingly, the magnet bar transfer head 323 can lift the magnet bar 70.

(S36) The magnet bar transfer head 323 transfers and places the lifted magnet bar 70 at a predetermined position away from the tray 30 on the pallet 40.

<Configuration and Operation of Tray Mounting Unit>

Figure 13:
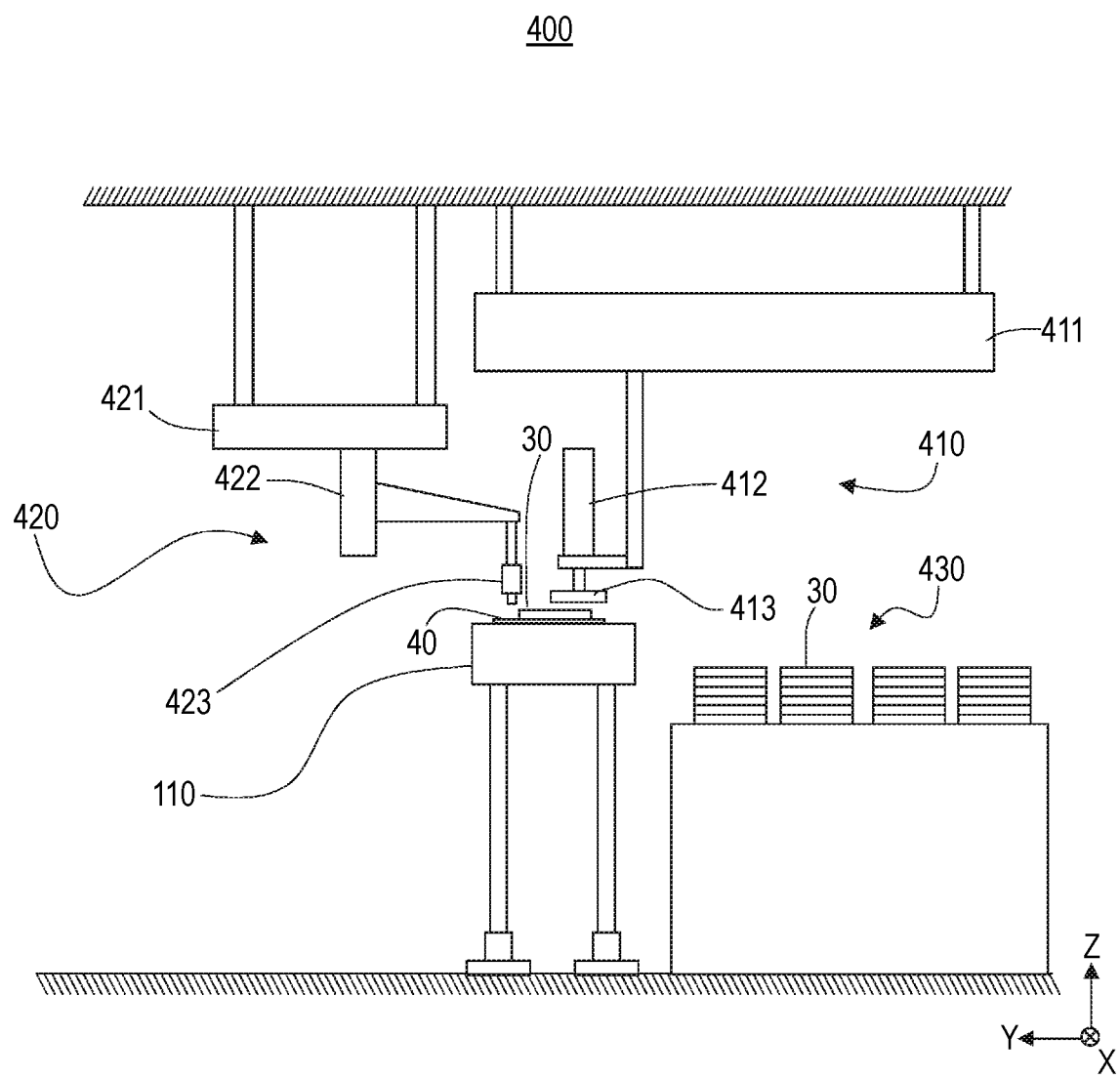
FIG. 13 is a schematic diagram showing a configuration example of a tray mounting unit.
Figure 14:
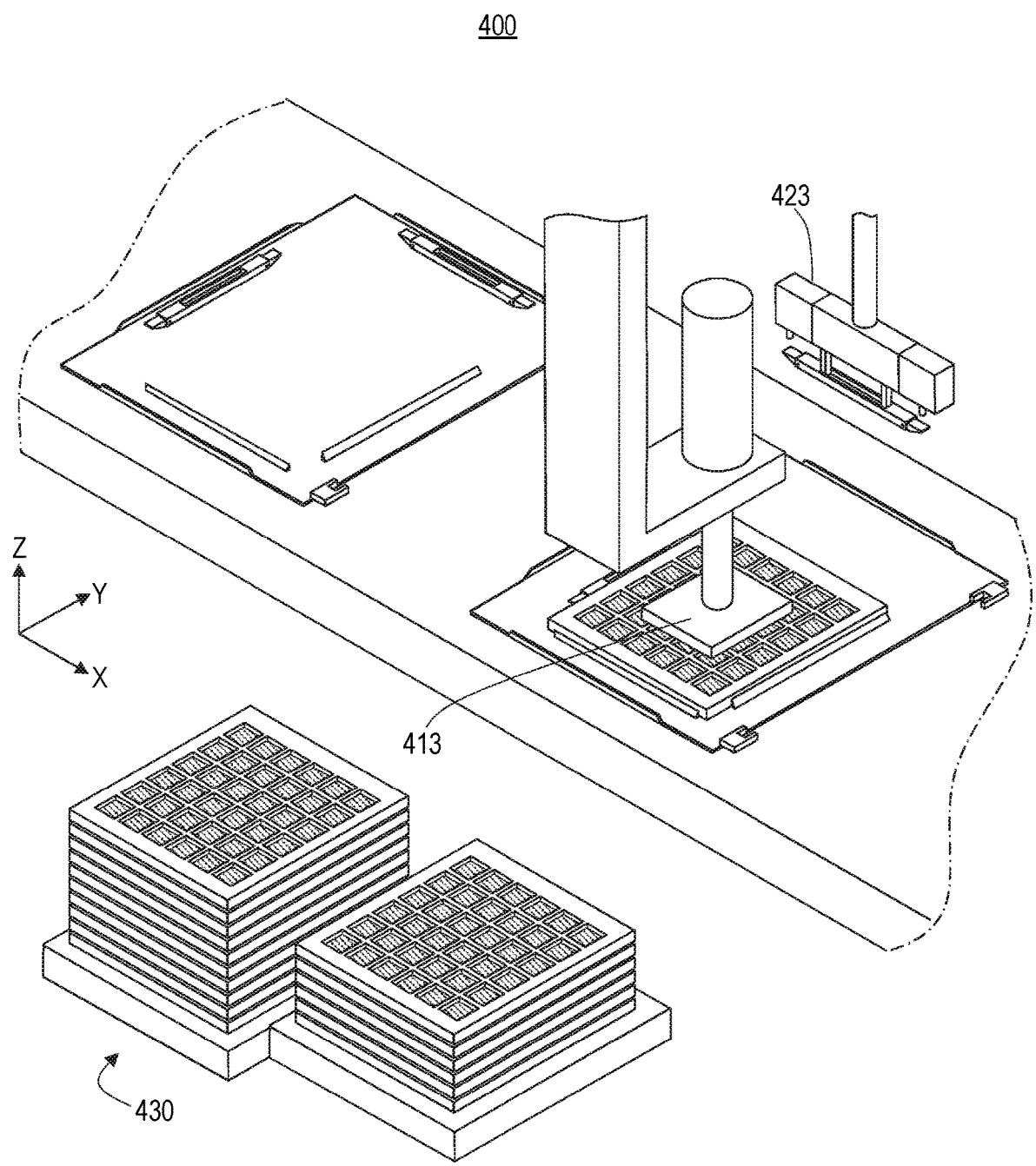
FIG. 14 is a main part perspective view showing a configuration example of the tray mounting unit.

FIG. 13 is a schematic diagram showing a configuration example of the tray mounting unit 400. FIG. 14 is a main part perspective view showing a configuration example of the tray mounting unit 400. Next, a configuration and operation of the tray mounting unit 400 will be described in detail with reference to FIGS. 13 and 14.

The tray mounting unit 400 includes a tray transfer unit 410, a magnet bar moving device 420, and a tray stock unit 430.

The tray mounting unit 400 is a device that mounts the tray 30, which holds components, on the pallet 40. The tray mounting unit 400 includes an XY table 411 that is movable in the XY axis direction, a lifting unit 412 that is connected to the XY table 411 and movable in the Z axis direction, and a tray transfer head 413 that is connected to the lifting unit 412 and can transfer the tray 30.

The magnet bar moving device 420 is an example of a tray fixing unit, and is a device that moves the magnet bar 70 of the pallet 40. The magnet bar moving device 420 includes an XY table 421 that is movable in the XY axis direction, a Z table 422 that is connected to the XY table 421 and movable in the Z axis direction, and a magnet bar transfer head 423 that is connected to the Z table 422 and can transfer the magnet bar 70. The magnet bar transfer head 423 may have the same configuration as that of the magnet bar transfer head 323 described with reference to FIGS. 11 and 12.

The tray stock unit 430 is a device or a place in which the tray 30 holding the components is stocked.

The tray mounting unit 400 performs, for example, the following operation.

(S41) As shown in FIG. 14, in the tray mounting unit 400, the XY table 411, the lifting unit 412, and the tray transfer head 413 are driven to transfer the tray 30 holding the components on the tray stock unit 430 on the pallet 40 conveyed by the conveyor 110. At this time, as shown in FIG. 4, the tray mounting unit 400 brings the sides of the tray 30 into contact with the tray positioning pieces 42A and 42B of the pallet 40, respectively.

(S42) As shown in FIG. 14, in the magnet bar moving device 420, the XY table 421, the Z table 422, and the magnet bar transfer head 423 are driven to unload the magnet bar 70 from the pallet 40, and the magnet bar 70 is placed at a position where the tray 30 is fixed as shown in FIG. 4. As a result, the tray 30 is positioned and fixed.

<Configuration and Operation of Information Writing Unit and Pallet Dispensing Unit>

Figure 15:
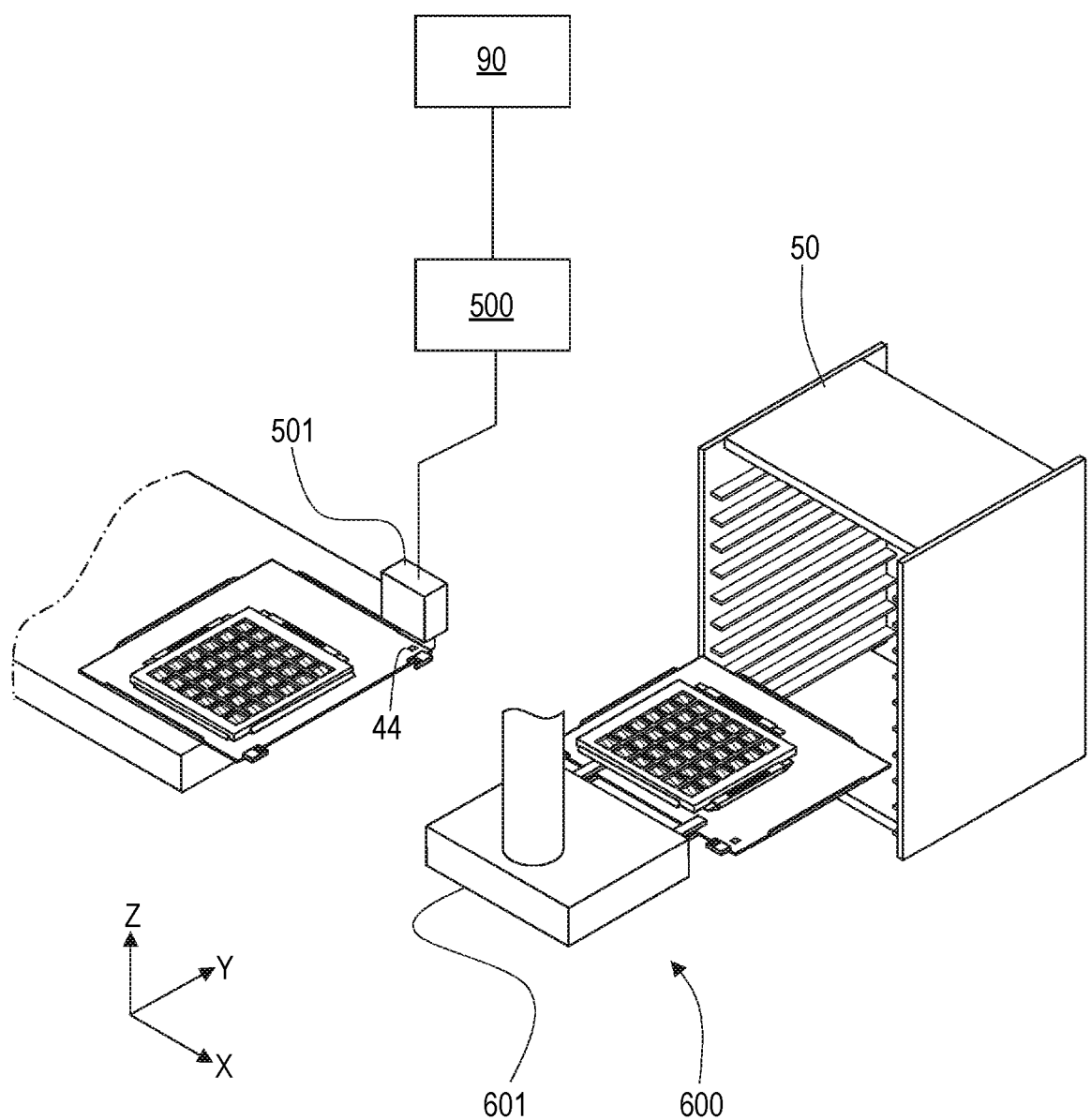
FIG. 15 is a main part perspective view showing a configuration example of an information writing unit and a pallet dispensing unit.

FIG. 15 is a main part perspective view showing a configuration example of the information writing unit 500 and the pallet dispensing unit 600. Next, the information writing unit 500 and the pallet dispensing unit 600 will be described in detail with reference to FIG. 15.

The information writing unit 500 is connected to a wireless communication unit 501 via a wired local area network (LAN) or a wireless LAN. The wireless communication unit 501 is a device that performs wireless communication with the wireless tag 44 of the pallet 40. The information writing unit 500 can transmit and receive information to and from a server 90 through a communication network such as a wired LAN, a wireless LAN, the Internet, a mobile phone network, or a combination thereof.

The information writing unit 500 writes the component information on a component in the tray 30 mounted on the pallet 40 to the wireless tag 44 of the pallet 40 through the wireless communication unit 501. The tray 30 holding the component may be mounted on the pallet 40 by the tray mounting unit 400. In addition, the information writing unit 500 writes pallet identification information, which is information for identifying the tray 30 attached to the pallet 40 and a tray 30 attached to another pallet 40, to the wireless tag 44 of the pallet 40 through the wireless communication unit 501. The information writing unit 500 transmits, to the server 90, the written component information and the pallet identification information in association with each other. The server 90 manages the transmitted component information and the transmitted pallet identification information in association with each other. Thus, in the server 90, a relationship among the pallet 40, the tray 30, and the components can be managed. The component information is, for example, a component name, a manufacturer name, a product rod number, dimensions and shape data of a component, and/or specification information. The pallet identification information is, for example, an ID or a serial number by which the tray-mounted pallet 40 can be uniquely identified. A plurality of trays 30 may be mounted on one pallet 40. When the pallet identification information is used, the pallet 40 on which the plurality of trays 30 are mounted can also be identified and managed.

The pallet dispensing unit 600 includes a pallet transfer robot 601. The pallet transfer robot 601 is a device that disposes the tray-mounted pallet 40, in which a component is held, in the magazine 50. The pallet transfer robot 601 may determine a magazine 50 as a disposing destination of the tray-mounted pallet 40 in which the component is held, in accordance with the pallet identification information written in the wireless tag 44. For example, in accordance with the pallet identification information, the pallet transfer robot 601 determines a magazine in which the tray-mounted pallet 40 holding the component is to be disposed, from a magazine 50 to be delivered to an automated warehouse, a magazine 50 to be delivered to a production line A, and a magazine 50 to be delivered to a production line B. In addition, the pallet transfer robot 601 may lift up a magazine 50 and place the magazine 50 on the AGV 60 corresponding to a destination of the magazine 50.

<Modification of Overall Configuration of Tray Handling Device>

Figure 16:
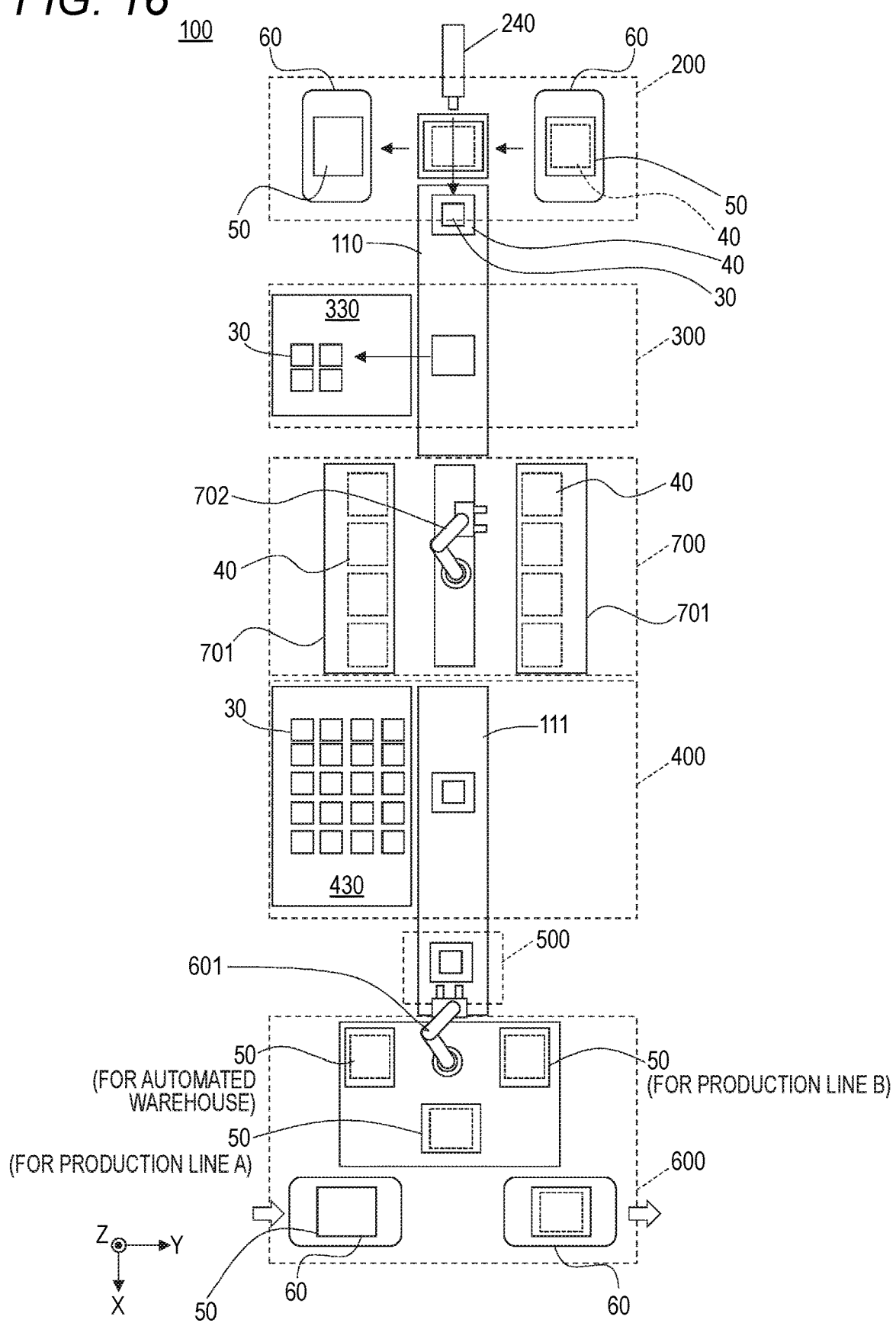
FIG. 16 is a diagram showing a modification of the overall configuration of the tray handling device according to the present embodiment, and is a diagram in which the tray handling device is viewed from above.

FIG. 16 is a diagram showing a modification of the overall configuration of the tray handling device 100 according to the present embodiment, and is a diagram of the tray handling device 100 viewed from above. The tray handling device 100 shown in FIG. 16 is different from that shown in FIG. 1 in that a pallet storing unit 700 is provided between the tray unloading unit 300 and the tray mounting unit 400.

The pallet storing unit 700 is a device and an area for storing the pallet 40. The pallet storing unit 700 includes stock shelves 701 and a pallet conveying robot 702.

The stock shelf 701 is a shelf having a plurality of storing positions for storing the pallet 40.

The pallet conveying robot 702 is a robot that conveys the pallet 40 to the stock shelf 701. The pallet conveying robot 702 conveys the pallet 40 to an empty storing position in the stock shelf 701.

When the pallet 40 on which the tray 30 holding the component is mounted is collected, the tray unloading unit 300 may not unload the tray 30 holding the component. Then, the pallet conveying robot 702 may store the pallet 40, on which the tray 30 holding the component is mounted, at an empty storing position of the stock shelf 701 as it is.

In addition, the pallet conveying robot 702 places the pallet 40 of the stock shelf 701 on the conveyor 111 connected to a next tray mounting unit 400 as necessary.

According to the configuration of the tray handling device 100 shown in FIG. 16, the pallet storing unit 700 can temporarily store a pallet 40 on which a tray 30 is not mounted and a pallet 40 on which a tray 30 holding a component is mounted. Accordingly, the flexibility of the supply of the pallet 40 to the tray mounting unit 400 is improved.

Although the embodiment has been described with reference to the accompanying drawings, the present disclosure is not limited to such an example. It will be apparent to those skilled in the art that various changes, modifications, substitutions, additions, deletions, and equivalents can be conceived within the scope of the claims, and it should be understood that such changes and the like also belong to the technical scope of the present disclosure. Components in the above embodiment may be optionally combined within a range not departing from the spirit of the invention.

The present application is based on Japanese Patent Application No. 2020-028729 filed on Feb. 21, 2020, the contents of which are incorporated herein by reference.

INDUSTRIAL APPLICABILITY

The technique of the present disclosure is useful for improving the efficiency of substrate manufacturing.

REFERENCE SIGNS LIST

10: Component mounting device
11: Substrate conveyance unit
12: Component mounting head
13: Substrate
20: Tray component supply device
21: Pallet moving device
30: Tray
31: Recessed portion
40: Pallet
41: Pallet body portion
42A, 42B: Tray positioning piece
43: Engagement portion
44: Wireless tag
50: Magazine
51: Support rail
52: Bottom plate
53: Top plate
54A: Left side plate
54B: Right side plate
60: AGV
70: Magnet bar
71: Body portion
72: Magnet portion
73: Recessed portion
74A, 74B: Lever portion
75: Shaft portion
90: Server
100: Tray handling device
110, 111: Conveyor
200: Pallet collecting unit
210: Magazine conveying device
211: XY Table
212: End effector
220: Pallet collection stage
230: Drive unit
240: Pallet pushing device
241: Pusher
300: Tray unloading unit
310: Tray removing unit
311: XY Table
312: Lifting unit
313: Tray suction head
320: Magnet bar removing device
321: XY Table
322: Z Table
323: Magnet bar transfer head
324: Holding portion
325A, 325B: Lever operation portion
326A, 326B: Pin
327A, 327B: Rod
330: Tray collecting unit
400: Tray mounting unit
410: Tray transfer unit
411: XY Table 412: Lifting unit
413: Tray transfer head
420: Magnet bar moving device
421: XY Table
422: Z Table
423: Magnet bar transfer head
430: Tray stock unit
500: Information writing unit
501: Wireless communication unit
600: Pallet dispensing unit
601: Pallet transfer robot
700: Pallet storing unit
701: Stock shelf
702: Pallet conveying robot

The invention claimed is:

1. A tray handling device configured to handle a tray used for supplying a component to a component mounting device configured to mount the component on a substrate, the tray handling device comprising:
 a tray unloading unit configured to unload the tray from a pallet collected from the component mounting device; and
 a tray mounting unit configured to mount the tray, which holds a component, on the pallet,
 wherein the tray unloading unit comprises:
  a releasing unit configured to release a state in which the tray is fixed to the pallet; and
  a tray removing unit configured to remove the tray from the pallet.

2. The tray handling device according to claim 1, further comprising:
 a pallet collecting unit configured to take out the pallet, on which the tray is mounted, from a magazine collected from the component mounting device.

3. The tray handling device according to claim 1,
 wherein the tray is fixed to the pallet by a tray fixing member configured to contact the tray, and
 wherein the releasing unit is configured to release a state in which the tray is fixed by the tray fixing member.

4. The tray handling device according to claim 3,
 wherein the tray mounting unit comprises:
  a tray transfer unit configured to transfer a tray stocked in a tray stock unit to the pallet; and
  a tray fixing unit configured to fix the tray, which is transferred, to the pallet, and
 wherein the tray fixing unit fixes the tray to the pallet by the tray fixing member.

5. The tray handling device according to claim 1,
 wherein the tray unloading unit comprises a tray collecting unit configured to collect the tray unloaded by the tray unloading unit.

6. The tray handling device according to claim 1,
 wherein the tray mounting unit comprises a tray transfer unit configured to transfer a tray stocked in a tray stock unit to the pallet.

7. The tray handling device according to claim 1, further comprising:
 wherein a storage unit allowing information to be read and written is attached to the pallet, and
 wherein the tray handling device further comprises an information writing unit configured to write information on the component held in the tray into the storage unit of the pallet on which the tray is mounted.

8. The tray handling device according to claim 7,
 wherein the information writing unit is configured to write identification information into the storage unit, the identification information for identifying the tray mounted on the pallet and a tray mounted on another pallet.

9. The tray handling device according to claim 8,
 wherein the information writing unit is configured to communicate with a server and transmit, to the server, the information on the component and the identification information in association with each other.

10. The tray handling device according to claim 7,
 wherein the storage unit is a wireless tag allowing information to be read and written wirelessly.

11. The tray handling device according to claim 1, further comprising:
 a pallet dispensing unit configured to dispose the pallet, on which the tray is mounted, in a magazine to be mounted on the component mounting device.

12. The tray handling device according to claim 1, further comprising:
 a pallet storing unit configured to store the pallet from which the tray is unloaded by the tray unloading unit.

13. The tray handling device according to claim 12,
 wherein the pallet storing unit comprises:
  a stock shelf having a plurality of storing positions in which the pallet is allowed to be stored; and
  a pallet conveying robot configured to: convey the pallet from which the tray is unloaded to an empty one of the storing positions; and supply the pallet stored in the storing position to the tray mounting unit.

14. A tray handling method for handling a tray used for supplying a component to a component mounting device configured to mount the component on a substrate, the tray handling method comprising:
 a tray unloading step of unloading the tray from a pallet collected from the component mounting device; and
 a tray mounting step of mounting a tray, which holds a component, on the pallet from which the tray is unloaded,
 wherein the tray unloading step comprises:
  a releasing step of releasing a state in which the tray is fixed to the pallet; and
  a tray removing step of removing the tray from the pallet.

15. The tray handling method according to claim 14,
 wherein the tray mounting step comprises:
  a tray transfer step of transferring a tray stocked in a tray stock unit to the pallet, and
  a tray fixing step of fixing the tray, which is transferred, to the pallet.

16. The tray handling method according to claim 14
 wherein a storage unit allowing information to be read and written is attached to the pallet, and
 wherein the tray handling method further comprises an information writing step of writing information on the component held in the tray into the storage unit of the pallet on which the tray is mounted.

17. The tray handling method according to claim 16,
 wherein the information writing step comprises writing identification information into the storage unit, the identification information for identifying the tray mounted on the pallet and a tray mounted on another pallet.

18. The tray handling method according to claim 17,
 wherein the information writing step comprises communicating with a server and transmitting, to the server, the information on the component and the identification information in association with each other.

19. The tray handling method according to claim 14, further comprising:

a pallet dispensing step of disposing the pallet, on which the tray is mounted, in a magazine to be mounted on the component mounting device.

* * * * *